United States Patent
Goldbach et al.

(10) Patent No.: US 8,823,138 B1
(45) Date of Patent: Sep. 2, 2014

(54) SEMICONDUCTOR RESISTOR INCLUDING A DIELECTRIC LAYER INCLUDING A SPECIES CREATING FIXED CHARGES AND METHOD FOR THE FORMATION THEREOF

(71) Applicant: GLOBALFOUNDRIES Inc., Grand Cayman (KY)

(72) Inventors: Matthias Goldbach, Dresden (DE); Martin Trentzsch, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/937,332

(22) Filed: Jul. 9, 2013

(51) Int. Cl.
*H01L 29/00* (2006.01)
*H01L 49/02* (2006.01)

(52) U.S. Cl.
CPC .................................. *H01L 28/20* (2013.01)
USPC ............................ 257/536; 257/537; 438/382

(58) Field of Classification Search
CPC ...... H01L 27/0629; H01L 28/24; H01L 28/20
USPC .................................. 257/536, 537; 438/382
See application file for complete search history.

(56) References Cited

U.S. PATENT DOCUMENTS

| 7,402,871 | B2 * | 7/2008 | Song ............................. 257/379 |
| 2011/0049642 | A1 * | 3/2011 | Scheiper et al. ............... 257/392 |
| 2011/0169100 | A1 * | 7/2011 | Shimizu et al. ................ 257/380 |
| 2011/0186916 | A1 * | 8/2011 | Kurz et al. ...................... 257/288 |

* cited by examiner

*Primary Examiner* — Trung Q Dang
(74) *Attorney, Agent, or Firm* — Amerson Law Firm, PLLC

(57) ABSTRACT

A semiconductor structure includes a resistor. The resistor includes a semiconductor region, a dielectric layer, a first electrical connection and a second electrical connection. The dielectric layer is provided on the semiconductor region and includes a high-k material having a greater dielectric constant than silicon dioxide. The dielectric layer includes a species creating fixed charges. A first electrical connection is provided at a first end of the semiconductor region and a second electrical connection is provided at a second end of the semiconductor region.

24 Claims, 9 Drawing Sheets

SEMICONDUCTOR RESISTOR INCLUDING A DIELECTRIC LAYER INCLUDING A SPECIES CREATING FIXED CHARGES AND METHOD FOR THE FORMATION THEREOF

BACKGROUND OF THE INVENTION

1. Field of the Invention

Generally, the present disclosure relates to the field of integrated circuits, and, in particular, to integrated circuits including resistors.

2. Description of the Related Art

Integrated circuits typically include a large number of circuit elements, which form an electric circuit. In addition to active devices such as, for example, field effect transistors and/or bipolar transistors, integrated circuits can include passive devices such as capacitors, inductivities and/or resistors.

Types of resistors that may be used in integrated circuits include resistors having a doped semiconductor region formed in a semiconductor material, wherein the doped semiconductor region is doped differently from other portions of the semiconductor material. The semiconductor material may, for example, be provided in the form of a portion of a bulk semiconductor substrate, such as a silicon wafer, or a layer of semiconductor material, for example silicon, that is provided above a layer of an electrically insulating material in a semiconductor-on-insulator (SOI) structure.

Electrical connections to the doped semiconductor region may be provided, wherein the electrical connections may be adapted to provide a substantially ohmic connection to the doped semiconductor region. Due to the doping of the doped semiconductor region that is different from the doping of other portions of the semiconductor material, a current flowing between the electrical connections may be substantially confined to the doped semiconductor region.

For a doped semiconductor region having a cross-sectional area A that is substantially constant between the electrical connections to the doped semiconductor region, the resistance of the resistor is given approximately by the equation $R=\rho*A/L$, wherein $\rho$ is the specific resistivity of the doped semiconductor region and L is the distance between the electrical connections. The product $\rho*A$ depends on the width of the doped semiconductor region, the dopant concentration in the doped semiconductor region and the depth of the doped semiconductor region.

The possibilities to reduce the width of the doped semiconductor region may be limited by a resolution of processes of photolithography. Moreover, the width of the doped semiconductor region, as well as its depth, may depend on characteristics of processes used for introducing dopants into the doped semiconductor region, such as ion implantation, and dopant diffusion processes. Since, therefore, the possibilities to reduce the width and depth of the doped semiconductor region are limited, a desired resistance R of the resistor is typically provided by adapting the dopant concentration in the doped semiconductor region and the distance L between the electrical connections to the doped semiconductor region.

The resistance R increases with increasing L, and increases when the dopant concentration is reduced. Therefore, for providing a resistor having a relatively high resistance, a compromise between low doping and relatively large dimensions of the resistor has to be found. While reducing the dopant concentration may be advantageous from the point of view of reducing the area required by the resistor, reducing the dopant concentration may lead to an increase of random dopant fluctuations. Additionally, line roughness may contribute to the variability of the resistance of a resistor device as described above.

Therefore, in the manufacturing of resistor devices as described above, providing a resistor wherein a desired value of the resistivity is obtained with a relatively high precision may be an issue.

The present disclosure provides semiconductor devices including resistors and methods for the formation thereof wherein the above-mentioned issue may be avoided or at least reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a resistor. The resistor includes a semiconductor region, a dielectric layer, a first electrical connection and a second electrical connection. The dielectric layer is provided on the semiconductor region and includes a high-k material having a greater dielectric constant than silicon dioxide. The dielectric layer includes a species creating fixed charges. The first electrical connection is provided at a first end of the semiconductor region and the second electrical connection is provided at a second end of the semiconductor region.

An illustrative method disclosed herein includes providing a semiconductor structure including a semiconductor region. A resistor is formed. The formation of the resistor includes forming a dielectric layer on the semiconductor region. The dielectric layer includes a high-k material having a greater dielectric constant than silicon dioxide and a species creating fixed charges. A first electrical connection is formed at a first end of the semiconductor region, and a second electrical connection is formed at a second end of the semiconductor region.

Another illustrative semiconductor structure disclosed herein includes a first and a second resistor. The first resistor includes a first semiconductor region, a first dielectric layer and a first pair of electrical connections. The first dielectric layer is provided on a surface of the first semiconductor region. The first dielectric layer includes a first high-k material having a greater dielectric constant than silicon dioxide. The first dielectric layer includes a first species creating fixed charges of a first polarity. The first pair of electrical connections is provided at opposite ends of the first semiconductor region. The second resistor includes a second semiconductor region, a second dielectric layer and a second pair of electrical connections. The second dielectric layer is provided on a surface of the second semiconductor region. The second dielectric layer includes a second high-k material having a greater dielectric constant than silicon dioxide. The second dielectric layer includes a second species creating second charges of a second polarity. The second polarity is opposite to the first polarity. The second pair of electrical connections is provided at opposite ends of the second semiconductor region. The first and the second semiconductor regions are differently doped.

BRIEF DESCRIPTION OF THE DRAWINGS

The disclosure may be understood by reference to the following description taken in conjunction with the accompanying drawings, in which like reference numerals identify like elements, and in which:

FIGS. 6-7 show schematic views of a semiconductor structure according to an embodiment, wherein FIG. 6 shows a schematic top view and FIG. 7 shows a schematic cross-sectional view;

FIGS. 8-9 show schematic views of a semiconductor structure according to an embodiment, wherein FIG. 8 shows a schematic top view and FIG. 9 shows a schematic cross-sectional view;

FIGS. 10-15 show schematic views of a semiconductor structure according to an embodiment in stages of a manufacturing process according to an embodiment, wherein FIGS. 10, 12, 13 and 14 show schematic cross-sectional views and FIGS. 11 and 15 show schematic top views.

Figure 1:
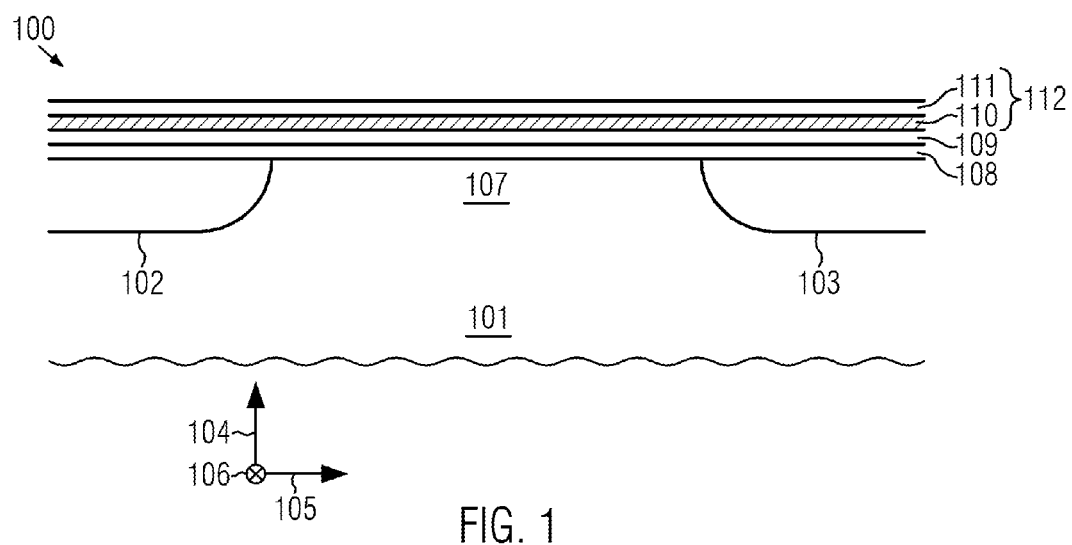
FIGS. 1-3 show schematic cross-sectional views of a semiconductor structure according to an embodiment in stages of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides techniques wherein species creating fixed charges are introduced into a dielectric layer. In some embodiments, lanthanum, barium, scandium, praseodymium, neodymium and/or aluminum may be provided in a high-k material such as, for example, an oxide of hafnium and/or an oxide of zirconium. Lanthanum, barium, scandium, praseodymium and neodymium may create positive fixed charges in a dielectric layer when embedded therein. Aluminum may create negative fixed charges in the dielectric layer when embedded therein. A typical potential shift due to fixed charges may be up to 1 V. The number of charges per area of the semiconductor region on which the dielectric layer is formed may be well controlled.

The fixed charges provided in the dielectric layer may provide a permanent field effect in the semiconductor region, so that charge carriers of a type opposite to the type of charge carriers provided by the doping of the semiconductor region may be obtained. The region wherein the charge carriers of the type opposite to the type of charge carriers provided by the doping of the semiconductor region are provided may provide an electrically conductive path having a resistivity between a first and a second electrical connection. The first and the second electrical connections may be provided at ends of the semiconductor region on which the dielectric layer having the fixed charges is provided. Since the number of charges per area of the dielectric layer may be well controlled, high precision high ohmic resistors may be realized.

Embodiments of resistors that may be realized using the above-described technique include horizontal resistors on silicon, surrounded by a shallow trench isolation structure, a vertical resistor at one side of a silicon ridge, a vertical resistor at two sides of a silicon ridge, and a horizontal resistor on silicon, surrounded by silicon, wherein the fixed charges are not present in the surrounding silicon. In some embodiments, the surrounding silicon may be substantially undoped.

In some embodiments, fixed charges of an opposite polarity may be provided in different resistors.

FIG. 1 shows a schematic cross-sectional view of a semiconductor structure 100 according to an embodiment in a stage of a manufacturing process according to an embodiment. The semiconductor structure 100 includes a substrate 101. The substrate 101 includes a semiconductor material, for example silicon. In some embodiments, the substrate 101 may be a bulk semiconductor substrate, for example a wafer or die of a semiconductor material. In other embodiments, the substrate 101 may be an SOI substrate including a layer of a semiconductor material, for example silicon, provided above a support substrate, which may be a semiconductor wafer or die, for example a silicon wafer or die, and separated therefrom by a layer of an electrically insulating material, for example silicon dioxide.

The substrate 100 may include a semiconductor region 107. In embodiments wherein the substrate 101 is a bulk semiconductor substrate, the semiconductor region 107 may be provided in the form of a portion of the substrate 101. In embodiments wherein the substrate 101 is an SOI substrate, the semiconductor region 107 may be provided in the form of a portion of the layer of semiconductor material of the substrate 101.

The semiconductor region 107 may be doped. The semiconductor region 107 may include a P-type dopant such as, for example, boron, or an N-type dopant such as, for example, arsenic. For doping the semiconductor region 107, ion implantation processes may be employed.

The semiconductor structure 100 may further include a first connection area 102 and a second connection area 103 that are provided at opposite ends of the semiconductor region 107, so that the semiconductor region 107 extends between the first connection area 102 and the second connection area 103. The connection areas 102, 103 may be doped differently than the semiconductor region 107.

In some embodiments, the doping of the connection areas 102, 103 may be inverse to the doping of the semiconductor region 107. In such embodiments, the semiconductor region 107 may be P-doped, and the connection areas 102, 103 may be N-doped. Alternatively, the semiconductor region 107 may be N-doped, and the connection areas 102, 103 may be P-doped. For doping the connection areas 102, 103, ion implantation processes may be performed.

The dopant concentration in the semiconductor region 107 may have a value that is approximately equal to typical dopant concentrations in the wells of field effect transistors that may be provided in and on other portions of the substrate 101, which are not shown in FIG. 1. The connection areas 102, 103 may have a dopant concentration that is approximately equal to a dopant concentration in source and drain regions of the field effect transistors provided in other portions of the semiconductor structure 100. In such embodiments, the doping of the semiconductor region 107 may be performed in the same ion implantation process as the doping of the wells of the field effect transistors, and the doping of the connection areas 102, 103 may be performed in the same ion implantation process as the doping of the source and drain regions of the field effect transistors.

In some embodiments, the connection areas 102, 103 may include a silicide. For forming the silicide, the semiconductor region 107 may be covered by a mask, for example a hard mask including silicon dioxide and/or silicon nitride, wherein the mask does not cover the connection areas 102, 103. A layer of a refractory metal, for example a layer of nickel, titanium and/or tungsten, may be deposited on the semiconductor structure 100, and an annealing process may be performed for initiating a chemical reaction between the refractory metal and the semiconductor material of the connection areas 102, 103. The mask may prevent a contact between the refractory metal and the semiconductor material of the semiconductor region 107, so that no silicide is formed in the semiconductor region 107. Thereafter, unreacted refractory metal and the mask may be removed.

The semiconductor structure 100 further includes a layer 108 of a dielectric material and a layer 109 of a dielectric material. The materials of the layers 108, 109 may be different from each other. The layer 108 is arranged closer to the substrate 101 than the layer 109. In some embodiments, the layer 108 may be formed directly on a surface of the semiconductor region 107, and the layer 109 may be formed on the layer 108.

The layer 108 may include silicon dioxide. The formation of the layer 108, when including silicon dioxide, may include a rapid thermal oxidation process, wherein the semiconductor structure 100 is exposed to an oxidizing ambient, for example a gas including oxygen and/or water vapor, and wherein the semiconductor structure 100 is exposed to an elevated temperature for inducing a chemical reaction between the oxidizing ambient and silicon from the semiconductor region 107. Alternatively and/or additionally, the formation of the layer 108 of dielectric material, when including silicon dioxide, may include a chemical vapor deposition process and/or a plasma enhanced chemical vapor deposition process adapted for depositing silicon dioxide.

The layer 109 may include a high-k dielectric material having a greater dielectric constant than silicon dioxide. In some embodiments, the layer 109 may be formed of a material having a dielectric constant greater than about 4. In particular, the layer 109 of dielectric material may include an oxide of hafnium, for example hafnium dioxide, and/or an oxide of zirconium, for example zirconium dioxide. In further embodiments, the layer 109 of dielectric material may include hafnium oxynitride and/or zirconium oxynitride. The layer 109 of dielectric material may be formed by means of techniques of chemical vapor deposition, plasma enhanced chemical vapor deposition and/or atomic layer deposition.

In some embodiments, for forming the layers 108, 109 of dielectric material, processes corresponding to those employed for forming gate insulation layers of field effect transistors wherein the high-k metal gate technique is employed may be used. Some parameters of deposition processes employed for forming the layers 108, 109 of dielectric material, however, may be different from parameters of deposition processes that are used for forming gate insulation layers of field effect transistors in the semiconductor structure 100. For example, a duration of the deposition processes may be different for obtaining thicknesses of the layers 108, 109 of dielectric material that are different from thicknesses of the gate insulation layers of the field effect transistors. In particular, the layers 108, 109 may have a greater thickness than material layers from which gate insulation layers of transistors are formed.

The semiconductor structure 100 further includes a layer 112 including a species that is suitable for creating fixed charges in the layer 109 of dielectric material and/or the layer 108 of dielectric material when incorporated therein. The species creating fixed charges may be a metal. In particular, the species creating fixed charges may include one or more elements of the group of materials including lanthanum, barium, scandium, praseodymium, neodymium and aluminum.

As mentioned above, in some embodiments, the layer 108 of dielectric material may include silicon dioxide, and the layer 109 of dielectric material includes an oxide of hafnium, an oxide of zirconium, hafnium oxynitride and/or zirconium oxynitride. In such embodiments, lanthanum, barium, scandium, praseodymium, neodymium, when incorporated into the layer 108 and/or the layer 109, may form positive fixed charges, and aluminum, when incorporated into the layer 108 and/or the layer 109, may form negative fixed charges.

In some embodiments, the layer 112 including the species creating fixed charges includes a metal layer 110 and a covering layer 111 that form sub-layers of the layer 112 including the species creating fixed charges. The metal layer 110 may include the species creating fixed charges itself, and the covering layer 111 may include a different material, for example titanium nitride.

The metal layer 110 may have a thickness in a range from about 5-10 Å, and the covering layer 111 may have a thickness in a range from about 10-30 Å, for example a thickness in a range from about 20-30 Å.

The metal layer 110 may be formed by means of techniques of physical vapor deposition, for example sputtering, and the covering layer 111, in particular when including titanium nitride, may be formed by means of physical vapor deposition, chemical vapor deposition and/or plasma enhanced chemical vapor deposition. In some embodiments, techniques for forming the metal layer 110 and the covering layer 111 may correspond to techniques used in the formation of metal layers and titanium nitride layers provided in gate electrodes of field effect transistors wherein the high-k metal gate technique is employed.

The metal layer 110 need not be formed directly on the layer 109 of dielectric material, as shown in FIG. 1. In some embodiments, the layer 112 including the species creating fixed charges may include an intermediate layer which may, for example, include titanium nitride, and may be provided between the layer 109 of dielectric material and the metal layer 110. In particular, in embodiments wherein the metal layer 110 includes aluminum, a titanium nitride intermediate layer having a thickness in a range from about 5-20 Å may be provided between the layer 109 of dielectric material and the metal layer 110. The intermediate layer may be formed by means of techniques of physical vapor deposition, chemical vapor deposition and/or plasma enhanced chemical vapor deposition.

The present disclosure is not limited to embodiments wherein the layer 112 including the species creating fixed charges includes a number of sub-layers formed of different materials, as described above. In other embodiments, the layer 112 including the species creating fixed charges may be substantially homogeneous. For example, the layer 112 including the species creating fixed charges may be formed of a chemical compound including titanium, nitrogen and at least one of lanthanum, barium, scandium, praseodymium, neodymium and aluminum. For example, the layer 112 including the species creating fixed charges may be a substantially homogeneous layer of titanium aluminum nitride or a substantially homogeneous layer of titanium lanthanum nitride. In such embodiments, the layer 112 including the species creating fixed charges may be formed by means of an atomic layer deposition process.

In FIG. 1, reference numeral 104 denotes a thickness direction of the substrate 101. Reference numerals 105, 106 denote horizontal directions of the substrate 101. The horizontal directions 105, 106 are perpendicular to each other, and are perpendicular to the thickness direction 104. In the cross-sectional view of FIG. 1, the thickness direction 104 of the substrate 101 is vertical, the horizontal direction 105 is horizontal, and the horizontal direction 106 is perpendicular to the plane of drawing, pointing away from the viewer, as indicated by a circle with an "X" at the center.

An extension of the substrate 101 in the thickness direction 104 may be smaller than an extension of the substrate 101 in any horizontal direction that is perpendicular to the thickness direction 104 and lies in the plane spanned by the horizontal directions 105, 106. The thickness direction 104 may be substantially perpendicular to the surface of the semiconductor region 107 on which the layers 108, 109 of dielectric material and the layer 112 including the species creating fixed charges are formed. Moreover, the thickness direction 104 may be substantially perpendicular to a surface of the semiconductor structure 100 on which circuit elements, such as field effect transistors (not shown), are formed.

Figure 2:
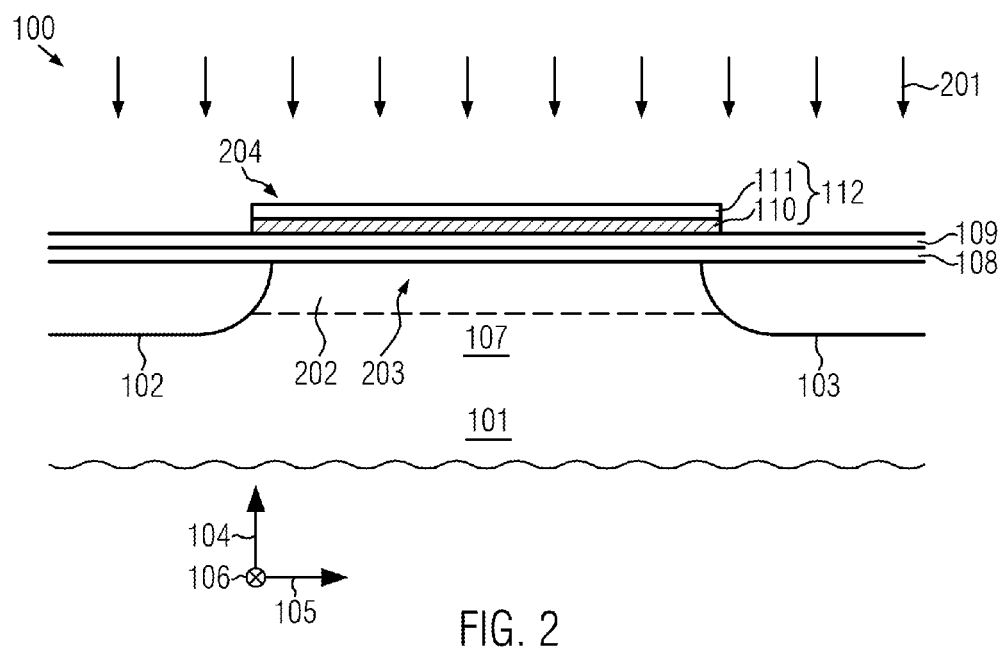

FIG. 2 shows a schematic cross-sectional view of the semiconductor structure 100 in a later stage of the manufacturing process. After the formation of the layers 108, 109 of dielectric material and the layer 112 including the species creating fixed charges, the layer 112 including the species creating fixed charges may be patterned. In the patterning process, portions of the layer 112 including the species creating fixed charges over the connection areas 102, 103 may be removed at least partially, whereas portions of the layer 112 including the species creating fixed charges over the semiconductor region 107 may remain on the semiconductor structure 100.

For patterning the layer 112 including the species creating fixed charges, a mask (not shown) may be formed over the semiconductor structure 100. The mask may be a photoresist mask and may be formed by means of a photolithography process. The mask may cover the portion of the layer 112 including the species creating fixed charges over the semiconductor region 107, whereas at least portions of the layer 112 including the species creating fixed charges over the connection areas 102, 103 are not covered by the mask.

After the formation of the mask, an etch process may be performed to remove those portions of the layer 112 including the species creating fixed charges that are not covered by the mask. In some embodiments, the etch process may be a wet etch process wherein the semiconductor structure 100 is exposed to a mixture of ammonium hydroxide, hydrogen peroxide and water according to the standard clean 1 (SC-1) step of the RCA cleaning process. Portions of the layer 112 including the species creating fixed charges that are covered by the mask may remain on the semiconductor structure 100, whereas those portions of the layer 112 including the species creating fixed charges that are not covered by the mask are removed. After the etch process, the mask may be removed. In embodiments wherein the mask is a photoresist mask, this may be done by means of a resist strip process.

After the patterning of the layer 112 including the species creating fixed charges, an annealing process may be performed, as schematically denoted by arrows 201 in FIG. 2. The annealing process 201 may be a high temperature anneal, wherein the semiconductor structure 100 is exposed to a temperature in a range from about 850-950° C. for a time in a range from about 5-60 seconds, in particular for a time in a range from about 10-60 seconds.

In the annealing process 201, the species creating fixed charges from the layer 112 may diffuse into the dielectric layer 109 and/or the dielectric layer 108. In particular, in embodiments wherein the layer 112 including the species creating fixed charges includes metal layer 110, as illustrated in FIG. 2, the metal from the metal layer 110, which may, for example, include lanthanum, barium, scandium, praseodymium, neodymium and/or aluminum, may diffuse into the dielectric layer 109 and/or the dielectric layer 108. The species creating fixed charges may be incorporated into the dielectric material of the layer 109 and/or the dielectric material of the layer 108 and create fixed charges therein, so that a dielectric layer 203 including fixed charges is formed. In embodiments wherein the species creating fixed charges includes lanthanum, barium, scandium, praseodymium and/or neodymium, the fixed charges may be positive charges. In embodiments wherein the species creating fixed charges includes aluminum, the fixed charges may be negative charges.

The type of the species creating fixed charges may be selected in accordance with the doping of the semiconductor region 107. In embodiments wherein the semiconductor region 107 is P-doped, a species creating positive fixed charges in the dielectric layers 108, 109 may be selected. In embodiments wherein the semiconductor region 107 is N-doped, a species creating negative charges in the dielectric layers 108, 109 may be selected.

The fixed charges in the dielectric layers 108, 109 may create an electric field that interacts with charge carriers in the semiconductor region 107. Thereby, a field effect region 202 may be formed at a surface of the semiconductor region 107 adjacent the dielectric layers 108, 109 including the fixed charges. The conductivity type of the field effect region 202 may be different from the conductivity type of other portions of the doped semiconductor region 107. In particular, in embodiments wherein the semiconductor region 107 is P-doped, the field effect region 202 may have an N-type conductivity wherein electrons are the majority charge carriers, and in embodiments wherein the semiconductor region 107 is N-doped, the field effect region 202 may have a P-type conductivity, wherein holes are the majority charge carriers.

As detailed above, the doping of the connection areas 102, 103 may be inverse to the doping of the semiconductor region 107. Thus, the conductivity type of the field effect region 202 may be the same as the conductivity type of the connection areas 102, 103, so that a flow of charge carriers between the connection areas 102, 103 and the field effect region 202 is not blocked by a PN transition. Thus, a substantially ohmic conductivity through the field effect region 202 may be obtained between the connection areas 102, 103, so that a substantially ohmic resistor 204 is obtained after the annealing process 201.

Figure 3:
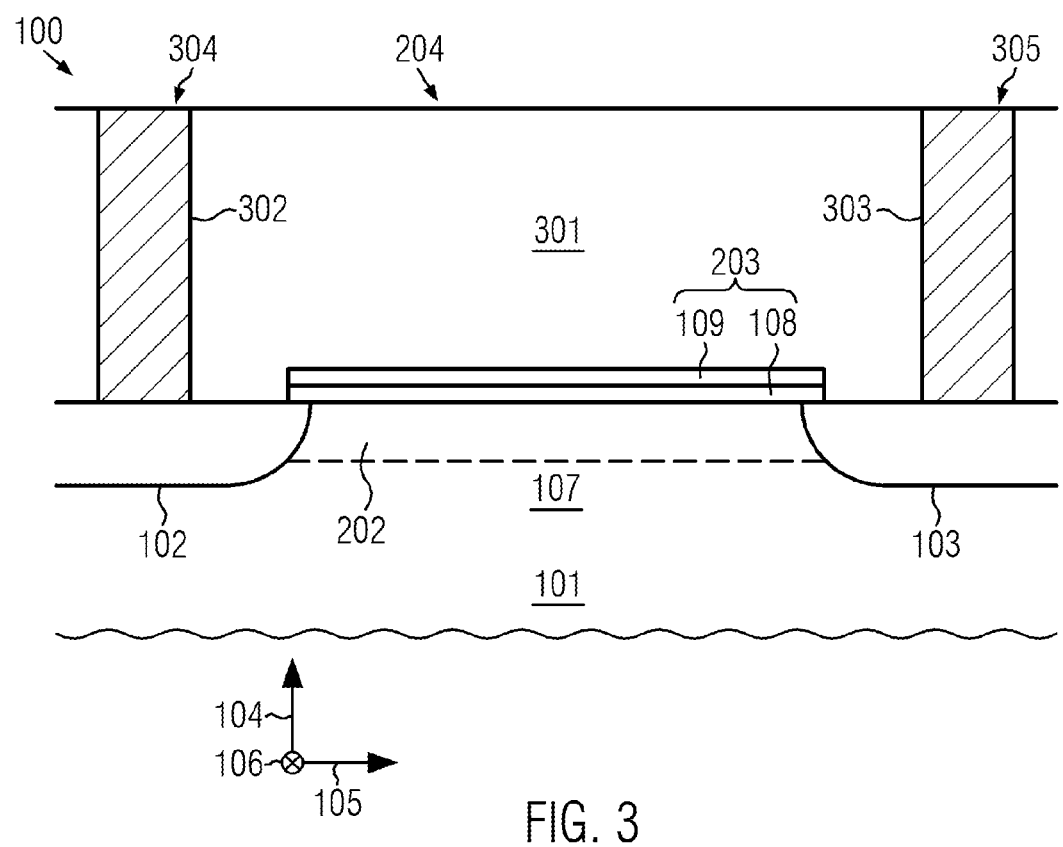

FIG. 3 shows a schematic cross-sectional view of the semiconductor structure 100 in a later stage of the manufacturing process. After the annealing process 201, residues of the layer 112 including the species creating fixed charges over the semiconductor region 107, which may, in particular, include components of the layer 112 other than the species creating fixed charges that has diffused into the layers 108, 109 of dielectric material, may be removed. Similar to the removal of the portions of the layer 112 over the connection areas 102, 103 in the patterning process described above, this may be done by exposing the semiconductor structure 100 to an etchant, in particular to a wet etchant, for example to an SC-1 solution as described above.

In some embodiments, portions of the dielectric layers 108, 109 over the connection areas 102, 103, may also be removed, whereas portions of dielectric layers 108, 109 which are provided over the semiconductor region 107 and include the fixed charges, as described above, may remain in the semiconductor structure 100. For this purpose, a mask (not shown) that covers the semiconductor region 107 but does not cover at least portions of the connection areas 102, 103 may be formed over the semiconductor structure 100. The mask may be a photoresist mask and may be formed by means of a photolithography process. Thereafter, the semiconductor structure 100 may be exposed to an etchant, for example to an aqueous solution of hydrogen fluoride, to remove portions of the dielectric layers 108, 109 over the connection areas 102, 103. The portions of the dielectric layers 108, 109 over the semiconductor region 107 that form the dielectric layer 203 including the species creating fixed charges may remain in the semiconductor structure 100.

In other embodiments, the removal of the portions of the dielectric layers 108, 109 over the connection areas 102, 103 may be omitted, so that portions of the dielectric layers 108, 109 remain over the connection areas 102, 103.

An interlayer dielectric 301 may be formed over the semiconductor structure 100. The interlayer dielectric 301 may include an electrically insulating material such as, for example, silicon dioxide, silicon nitride and/or silicon oxynitride. The interlayer dielectric 301 may be deposited directly on the dielectric layer 203 including the species creating fixed charges. Thus, different from a field effect transistor including a gate insulation layer that includes silicon dioxide and/or a high-k material having a greater dielectric constant than silicon dioxide, no gate electrode is provided above the semiconductor region 107. Accordingly, the electric field acting on the semiconductor region 107 that creates the field effect region 202 may remain substantially constant. Thus, different from a field effect transistor, wherein the resistance of the channel region depends on an electric voltage applied to the gate electrode, the resistance between the connection areas 102, 103 that is provided by the field effect region 202 may remain substantially constant. Thus, the resistor 204 may provide a substantially constant ohmic resistivity.

After the deposition of the interlayer dielectric 301, contact vias 302, 303 may be formed in the interlayer dielectric 301. The contact vias 302, 303 are located over the connection area 102 and the connection area 103, respectively. The contact vias 302, 303 may be formed by means of techniques of photolithography and etching. In embodiments wherein portions of the dielectric layers 108, 109 over the connection areas 102, 103 are not removed before the formation of the interlayer dielectric 301, after the formation of the contact vias 302, 303, the semiconductor structure 100 may be exposed to an etchant adapted to remove the materials of the dielectric layers 108, 109 from the bottom surface of the contact vias 302, 303 to expose the connection areas 102, 103 at the bottom of the contact vias 302, 303.

After the formation of the contact vias 302, 303, the contact vias 302, 303 may be filled with a metal, for example tungsten. For this purpose, a metal layer may be deposited over the semiconductor structure 100, and a chemical mechanical polishing process may be performed for planarizing the surface of the semiconductor structure 100 and for removing portions of the metal outside the contact vias 302, 303.

A metal fill 304 of the contact via 302 may provide a substantially ohmic electrical connection to the connection area 102, and a metal fill 305 of the contact via 303 may provide a substantially ohmic electrical connection to the connection area 103. Thus, the metal fill 304 of the contact via 302 and the connection area 102 provide a first electrical connection of the resistor 204 at a first end of the semiconductor region 107, and the metal fill 305 of the contact via 303 and the connection area 103 provide a second electrical connection of the resistor 204 at a second end of the semiconductor region 107.

The present disclosure is not limited to embodiments wherein the dielectric layer 203 including the species creating fixed charges is formed by forming a layer 112 including the species creating fixed charges over dielectric layers 108, 109 and diffusing the species creating fixed charges into the dielectric layers 108, 109 by an annealing process 201, as described above. In other embodiments, a dielectric layer including a species creating fixed charges may be formed by depositing a layer of a dielectric material including a species creating fixed charges, wherein the species creating fixed charges is already incorporated into the dielectric material during the deposition process.

In such embodiments, after forming the layer 108 of dielectric material as described above with reference to FIG. 1, a layer including a chemical compound including hafnium, oxygen and at least one of lanthanum, barium, scandium, praseodymium, neodymium and aluminum may be deposited over the semiconductor structure 100. In some embodiments, the layer may include hafnium aluminum oxide. In other embodiments, the layer may include hafnium lanthanum oxide. The layer including the chemical compound including hafnium, oxygen and at least one of lanthanum, barium, scandium, praseodymium, neodymium and aluminum may be deposited by means of an atomic layer deposition process.

Thereafter, portions of the dielectric layer over the connection areas 102, 103 may optionally be removed, and an interlayer dielectric similar to interlayer dielectric 301 described above with reference to FIG. 3, and contact vias filled with a metal similar to contact vias 302, 303 described above with reference to FIG. 3 may be formed for providing an electrical connection to the connection areas 102, 103.

Further embodiments will be described with reference to FIGS. 4 and 5. For convenience, in FIGS. 1-3 on the one hand, and FIGS. 4-5 on the other hand, like reference numerals have been used to denote like components. Features of components shown in FIGS. 4-5 may correspond to features of components explained above with reference to FIGS. 1-3 denoted by like reference numerals, and corresponding methods may be employed for the formation thereof.

Figure 4:
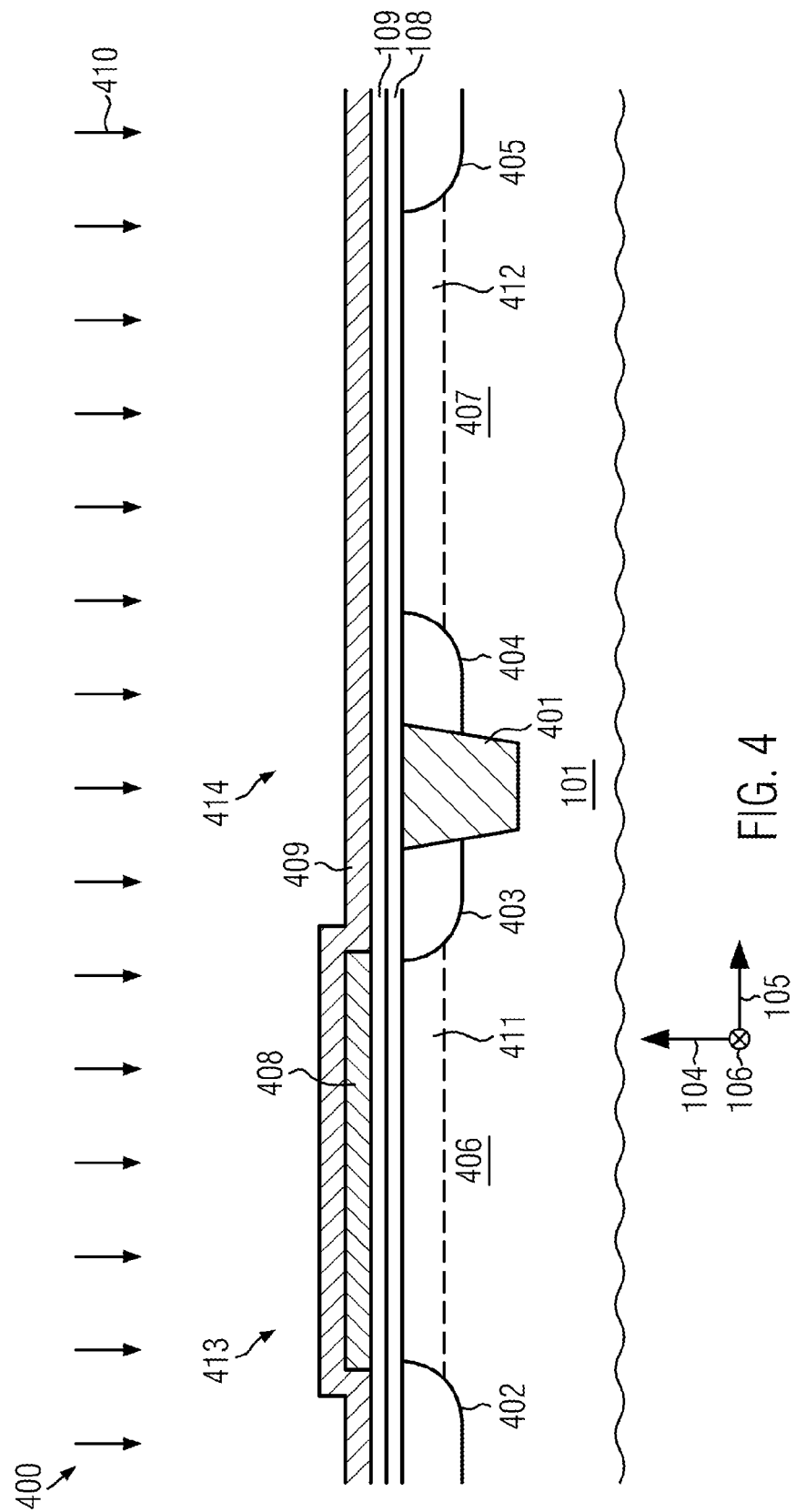
FIGS. 4-5 show schematic cross-sectional views of a semiconductor structure according to an embodiment in stages of a manufacturing process according to an embodiment.

FIG. 4 shows a schematic cross-sectional view of a semiconductor structure 400 according to an embodiment in a stage of a manufacturing process according to an embodiment. The semiconductor structure 400 includes a substrate 101, a resistor 413 and a resistor 414. A trench isolation structure 401, which may, for example, be a shallow trench isolation structure, provides electrical insulation between the resistors 413, 414. For forming the trench isolation structure 401, methods including photolithography, etching, oxidation, deposition and/or planarization may be employed.

The resistor 413 includes a semiconductor region 406 and connection areas 402, 403. The semiconductor region 406 and the connection areas 402, 403 may be doped, wherein the doping of the semiconductor region 406 is opposite to the doping of the connection areas 402, 403. Further features of the semiconductor region 406 and the connection areas 402, 403 may correspond to those of the semiconductor region 107 and the connection areas 102, 103 described above with reference to FIGS. 1-3.

The resistor 414 includes a semiconductor region 407 and connection areas 404, 405 provided at opposite ends of the semiconductor region 407. The semiconductor region 407 and the connection areas 404, 405 may be doped, wherein the doping of the semiconductor region 407 is opposite to the doping of the connection areas 404, 405. Further features of the semiconductor region 407 and the connection areas 404, 405 may correspond to those of the semiconductor region 107 and the connection areas 102, 103 described above with reference to FIGS. 1-3.

The doping of the semiconductor region 406 may be opposite to the doping of the semiconductor region 407, and the doping of the connection areas 402, 403 may be opposite to the doping of the connection areas 404, 405. For example, the semiconductor region 406 and the connection areas 404, 405 may be P-doped and the semiconductor region 407 and the connection areas 402, 403 may be N-doped. Alternatively, the semiconductor region 406 and the connection areas 404, 405 may be N-doped and the semiconductor region 407 and the connection areas 402, 403 may be P-doped.

The semiconductor structure 400 further includes layers 108, 109 of dielectric material which may have features corresponding to those of the layers 108, 109 of dielectric material described above with reference to FIGS. 1-3.

The semiconductor structure 400 further includes a layer 408 including a species creating fixed charges when incorporated into the layers 108, 109 of dielectric material. The species creating fixed charges may be selected in accordance with the doping of the semiconductor region 406. In embodiments wherein the semiconductor region 406 is P-doped, a species creating positive fixed charges such as, for example, lanthanum, barium, scandium, praseodymium and/or neodymium may be provided in the layer 408. In embodiments wherein the semiconductor region 406 is N-doped, a species creating negative fixed charges when incorporated into the layers 108, 109 of dielectric material may be provided in the layer 408.

The layer 408 may include a plurality of sub-layers, similar to the metal layer 110 and the covering layer 111 described above with reference to FIG. 2. Optionally, an intermediate layer including the same material as the covering layer may be provided between the metal layer and the layer 109 of dielectric material.

In embodiments wherein the semiconductor region 406 is N-doped, the layer 408 may include an aluminum layer formed directly on the layer 109 of dielectric material, and a titanium nitride layer formed on the aluminum layer. In embodiments wherein the semiconductor region 406 is P-doped, the layer 408 may include a first titanium nitride layer formed directly on the dielectric layer 109, a metal layer including at least one of lanthanum, barium, scandium, praseodymium and/or neodymium, for example a lanthanum layer, provided on the first titanium nitride layer, and a second titanium nitride layer provided on the metal layer.

As illustrated in FIG. 4, the layer 408 including the species creating fixed charges may be provided on the semiconductor region 406, wherein the resistor 414 and, optionally, the connection areas 402, 403 of the resistor 413 are not covered by the layer 408. This may be obtained by depositing the layer 408 including the species creating fixed charges over the semiconductor structure 400, and patterning the layer 408 by forming a mask and performing an etch process. The etch process may, for example, be a wet etch process wherein an etchant in accordance with the standard cleaning process SC-1 is employed for removing portions of the layer 408 over the resistor 414 and, optionally, the connection areas 402, 403 of the resistor 413.

The semiconductor structure 400 further includes a layer 409 including a species creating fixed charges when incorporated into the dielectric material of the layers 108, 109 of dielectric material. The layer 409 may be deposited after the deposition and patterning of the layer 408 described above. The species creating fixed charges in the layer 409 may be selected in accordance with the doping of the semiconductor region 407.

In embodiments wherein the semiconductor region 407 is N-doped, the layer 409 may include a species creating negative fixed charges when incorporated into the layers 108, 109 of dielectric material. For example, the layer 409 may include a layer of aluminum formed directly on a portion of the dielectric layer 109 over the semiconductor 407, and a titanium nitride layer formed on the aluminum layer.

In embodiments wherein the semiconductor region 407 is P-doped, the layer 409 may include a species creating positive fixed charges when incorporated into the dielectric material of the layers 108, 109 of dielectric material. For example, the layer 409 may include a first layer of titanium nitride formed directly on the portion of the dielectric layer 109 over the semiconductor region 407, a layer including at least one of lanthanum, barium, scandium, praseodymium and/or neodymium, for example a lanthanum layer, on the first titanium nitride layer, and a second titanium nitride layer formed on the metal layer.

Further features of each of the layers 408, 409 including species creating fixed charges, and methods used for their formation, may correspond to those of the layer 112 described above with reference to FIGS. 1-3.

In alternative embodiments, the layers 408, 409 including species creating fixed charges may be substantially homogeneous layers, as described above with reference to FIGS. 1-3.

After the formation of the layers 408, 409 including species creating fixed charges, an annealing process may be performed, as schematically denoted by arrows 410 in FIG. 4. The annealing process 410 may be a high temperature annealing process wherein the semiconductor structure 400 is exposed to a temperature in a range from about 850-950° C. for a time in a range from about 5-60 seconds.

In the annealing process 410, species creating fixed charges may diffuse into the layers 108, 109 of dielectric material. In particular, the species creating fixed charges from the layer 408 may be incorporated into the portions of the layers 108, 109 of dielectric material over the semiconductor region 406, and the species creating fixed charges from the layer 409 may be incorporated into portions of the layers 108, 109 of dielectric material over the semiconductor region 407. The fixed charges may create a field effect region 411 in the resistor 413 and a field effect region 412 in the resistor 414. Features of the field effect regions 411, 412 may correspond to those of the field effect region 202 described above with reference to FIGS. 1-3. In particular, the field effect region 411 may provide a substantially ohmic resistance between the connection areas 402, 403, and the field effect region 412 may provide a substantially ohmic resistance between the connection areas 404, 405.

As detailed above, the species creating fixed charges provided in the layer 408 may be different from the species creating fixed charges provided in the layer 409. Thus, fixed charges of opposite polarity may be provided in the portions of the dielectric layers 108, 109 over the semiconductor region 406, on the one hand, and in the portions of the dielectric layers 108, 109 over the semiconductor region 407, on the other hand.

Figure 5:
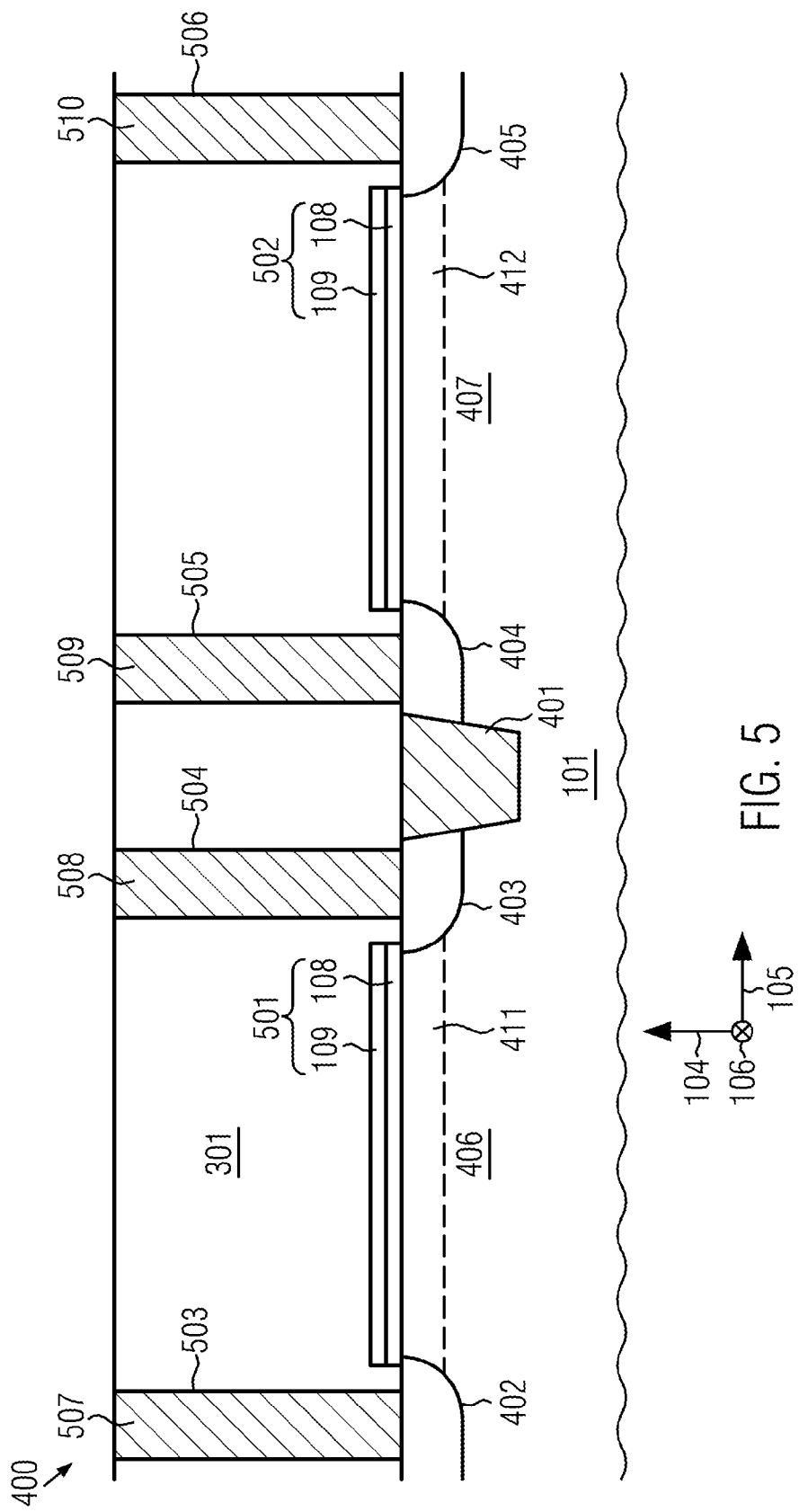

FIG. 5 shows a schematic cross-sectional view of the semiconductor structure 400 in a later stage of the manufacturing process. After the annealing process 410, the layers 408, 409 may be removed by means of an etch process, for example a wet etch process wherein the semiconductor structure 400 is exposed to an SC-1 solution. Thereafter, portions of the layers 108, 109 of dielectric material over the connection areas 402, 403, 404, 405 and the trench isolation structure 401 may be removed, for example by means of a wet etch process wherein an aqueous solution of hydrogen fluoride is employed. Masks may be formed over the semiconductor regions 406, 407 before exposing the semiconductor structure 400 to the aqueous solution of hydrogen fluoride, so that portions of the layers 108, 109 of dielectric material over the semiconductor region 406 and portions of the layers 108, 109 of dielectric material over the semiconductor region 407 remain in the semiconductor structure 400, forming a first dielectric layer 501 including a first species creating fixed charges over the semiconductor region 406 and a second dielectric layer 502 including a second species creating fixed charges over the semiconductor region 407.

Thereafter, an interlayer dielectric 301 may be deposited on the semiconductor structure 400, and contact vias 503, 504, 505, 506 having metal fills 507, 508, 509, 510 may be formed for providing electrical connections to the connection areas 402, 403, 404, 405, respectively. Features of the contact vias 503, 504, 505, 506 and the metal fills 507, 508, 509, 510 may correspond to those of the contact vias 302, 303 and the metal fills 304, 305 described above with reference to FIG. 3.

Figure 6:
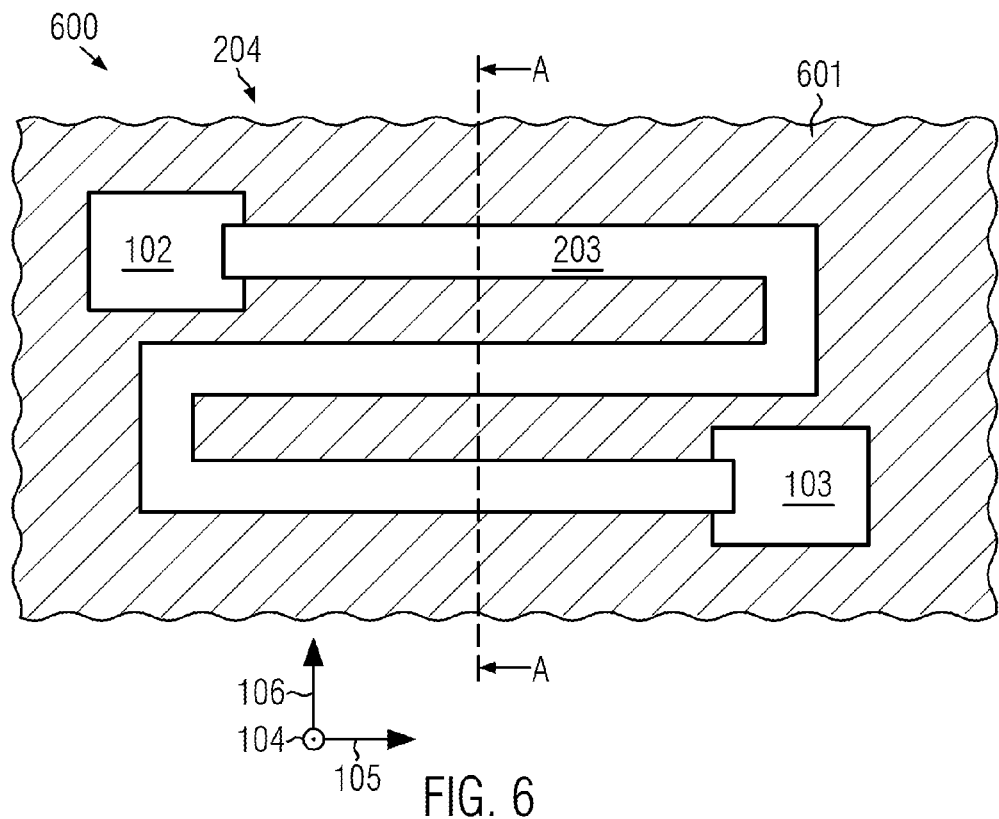
Figure 7:
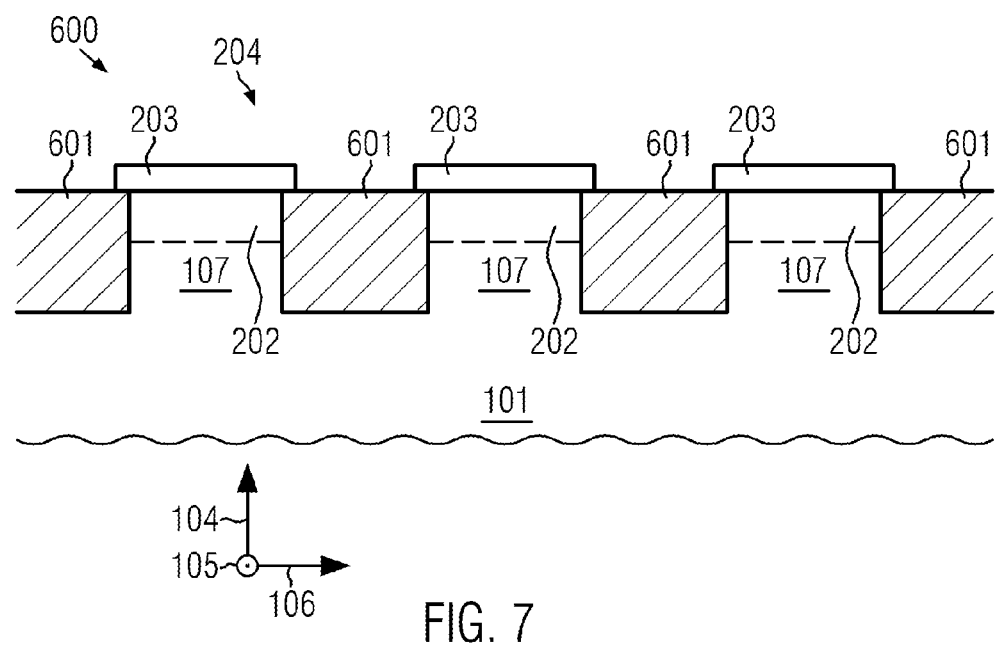

Further embodiments will be described with reference to FIGS. 6 and 7. FIG. 6 shows a schematic top view of a semiconductor structure 600 according to an embodiment. A schematic cross-sectional view of the semiconductor structure 600 along the line A-A shown in FIG. 6 is shown in FIG. 7. For convenience, in FIGS. 1-5, on the one hand, and in FIGS. 6-7, on the other hand, like reference numerals have been used to denote like components. Features of components shown in FIGS. 6 and 7 may correspond to features of components shown in FIGS. 1-5 denoted by like reference numerals, and corresponding methods may be used for the formation thereof, unless explicitly stated otherwise.

The semiconductor structure 600 includes a substrate 101 and a resistor 204. The resistor 204 includes a semiconductor region 107, a first connection area 102 at a first end of the semiconductor region 107 and a second connection area 103 at a second end of the semiconductor region 107. On the semiconductor region 107, a dielectric layer 203 including a species creating fixed charges is provided. The fixed charges in the dielectric layer 203 provide a field effect region 202 in the semiconductor region 107, wherein the field effect region 202 provides a substantially ohmic electrical resistance between the connection areas 102, 103.

In the embodiment of FIGS. 6 and 7, the semiconductor region 107 has a serpentine shape, so that, in the cross-sectional view of FIG. 7, three portions of the semiconductor region 107, corresponding to windings of the serpentine, are arranged adjacent each other. However, the number of windings of the serpentine shape of the semiconductor region 107 is not limited to three, as shown in FIGS. 6 and 7. In other embodiments, a greater or smaller number of windings of the serpentine shape may be provided.

The semiconductor structure 600 further includes a trench isolation structure 601 provided adjacent the semiconductor region 107 and the connection areas 102, 103. The trench isolation structure 601 may be a shallow trench isolation structure, and may include a trench filled with an electrically insulating material such as, for example, silicon dioxide. The trench isolation structure 601 may be formed by forming a trench in the substrate 101 of the semiconductor structure 600 by means of an etch process, wherein portions of the substrate wherein the semiconductor region 107 and the connection areas 102, 103 are to be formed are covered by a mask, for example a photoresist mask, so that they are protected from being affected by the etchant and remain in the semiconductor structure 600. The etch process may be an anisotropic etch process, for example a dry etch process, such as a reactive ion etch process.

After the etch process, the mask may be removed from the semiconductor structure 600, and the trench may be filled with the electrically insulating material. This may be done by means of techniques of oxidation and/or deposition. Thereafter, a planarization process may be performed for removing portions of the electrically insulating material outside the trench and for obtaining a substantially planar surface of the semiconductor structure 600. Then, processes as described above with reference to FIGS. 1-5 may be performed for forming the resistor 204 in the semiconductor structure 600.

In some embodiments, the semiconductor region 107 may be P-doped, and the layer 203 including a species creating fixed charges may include at least one of lanthanum, barium, scandium, praseodymium and/or neodymium for providing positive fixed charges in the layer 203 including a species creating fixed charges. In such embodiments, the connection areas 102, 103 may be N-doped.

In some embodiments, the dielectric layer 203 including the species creating fixed charges may be formed after an etch process that is performed for forming sidewall spacers adjacent gate electrodes of field effect transistors that are formed in other portions of the semiconductor structure 600 (not shown) and/or after ion implantation processes that are performed for forming source and drain regions of the field effect transistors.

On the semiconductor structure 600 as shown in FIGS. 6 and 7, an interlayer dielectric similar to the interlayer dielectric 301 described above with reference to FIGS. 1-3 may be deposited, and contact vias filled with a metal similar to the contact vias 302, 303 described above with reference to FIG. 3 may be formed for providing electrical connections to the connection areas 102, 103.

Figure 8:
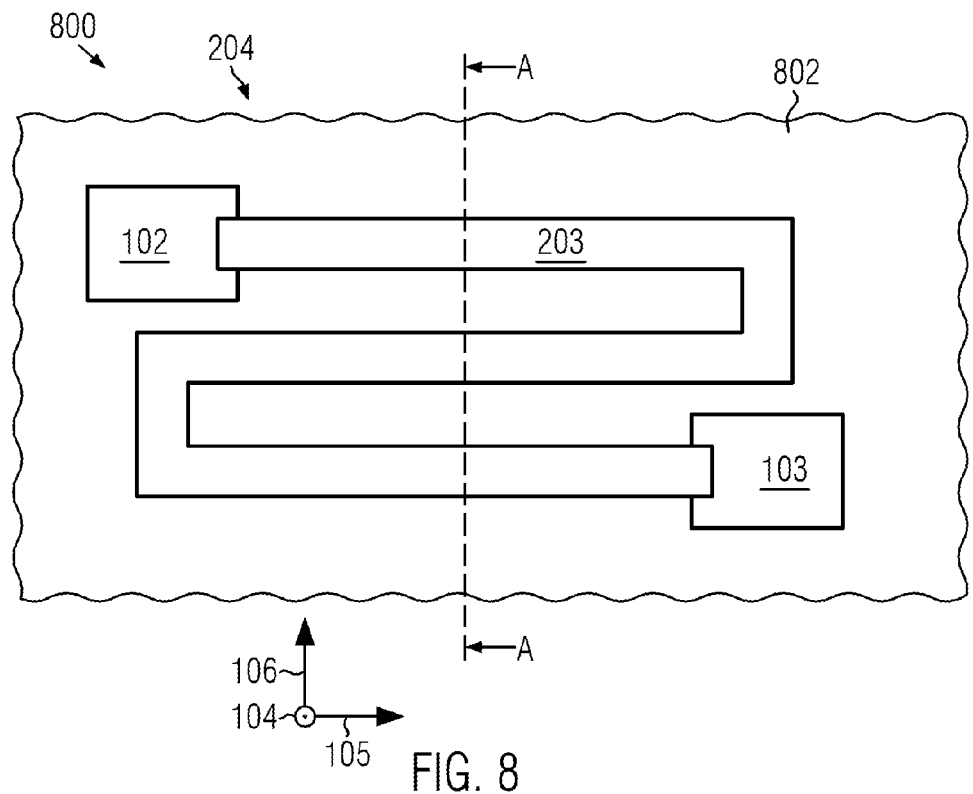
Figure 9:
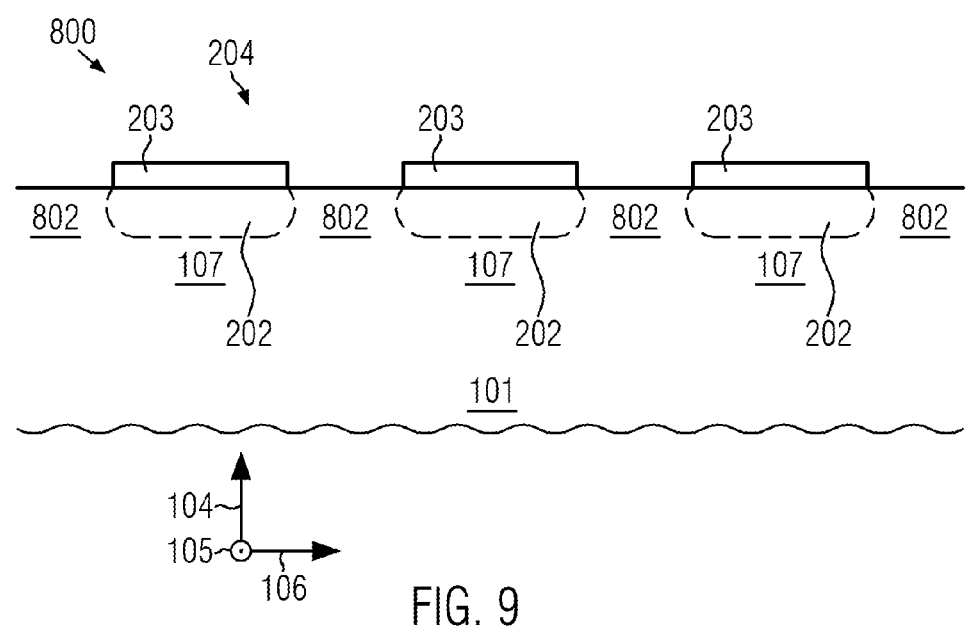

Further embodiments will be described with reference to FIGS. 8 and 9. FIG. 8 shows a schematic top view of a semiconductor structure 800 according to an embodiment. A schematic cross-sectional view of the semiconductor structure 800 along the line A-A shown in FIG. 8 is shown in FIG. 9. For convenience, in FIGS. 1-7 and in FIGS. 8-9, like reference numerals have been used to denote like components. Features of components shown in FIGS. 8-9 may correspond to features of components shown in FIGS. 1-7 denoted by like reference numerals, and like methods may be used for the formation thereof, unless explicitly stated otherwise.

The semiconductor structure 800 includes a substrate 101 and a resistor 204. The resistor 204 includes a first connection area 102 and a second connection area 103 provided at a first end and a second end, respectively, of a semiconductor region 107 that is covered by a dielectric layer 203 including a species creating fixed charges. The presence of the fixed charges in the layer 203 may create a field effect region 202 in the semiconductor region 107 adjacent the layer 203 including the species creating fixed charges.

As described above with reference to FIGS. 1-7, the semiconductor region 107 covered by the dielectric layer 203 may be doped, and the field effect region 202 may include majority charge carriers of a type opposite to the type of charge carriers provided by the dopant in the semiconductor region 107. For example, the semiconductor region 107 may be P-doped, and the layer 203 may include one or more of lanthanum, barium, scandium, praseodymium and/or neodymium, for providing a field effect region 202 having an N-type conductivity.

Adjacent the semiconductor region 107 and the connection areas 102, 103, a semiconductor material 802 that is not covered by the dielectric layer 203 including fixed charges may be provided. The semiconductor material 802 that is not covered by the dielectric layer 203 including the species creating fixed charges may be substantially undoped. For providing the substantially undoped semiconductor material 802, portions of the substrate 101 adjacent the connection areas 102, 103 and the semiconductor region 107 may be covered by a mask, for example a photoresist mask, during ion implantation processes wherein dopants are introduced into the connection areas 102, 103 and the semiconductor region 107. The substantially undoped semiconductor material 802 may have a relatively small intrinsic conductivity only, so that substantially no current flow through the substantially undoped semiconductor material 802 is obtained, and a current flowing between the connection areas 102, 103 of the resistor flows substantially only through the field effect region 202, even in the absence of a trench isolation structure as described above with reference to FIGS. 6 and 7.

Further features of the semiconductor structure 800 and methods used for the formation thereof may correspond to those of the semiconductor structure 600 described above with reference to FIGS. 6 and 7.

The present disclosure is not limited to embodiments wherein a layer of dielectric material including a species creating fixed charges is formed on a surface of a semiconductor region that is substantially perpendicular to the thickness direction 104 of the substrate 101 of the semiconductor structure, as described above with reference to FIGS. 1-9. In other embodiments, a layer of dielectric material including a species creating fixed charges may be provided on a surface of a semiconductor region that is substantially parallel to the thickness direction 104. In the following, such embodiments will be described with reference to FIGS. 10-16.

Figure 10:
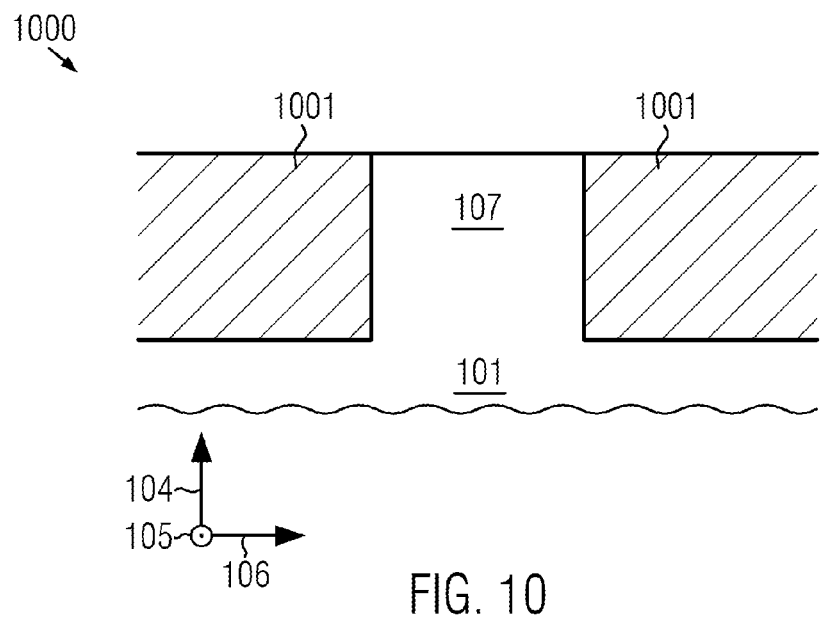
Figure 11:
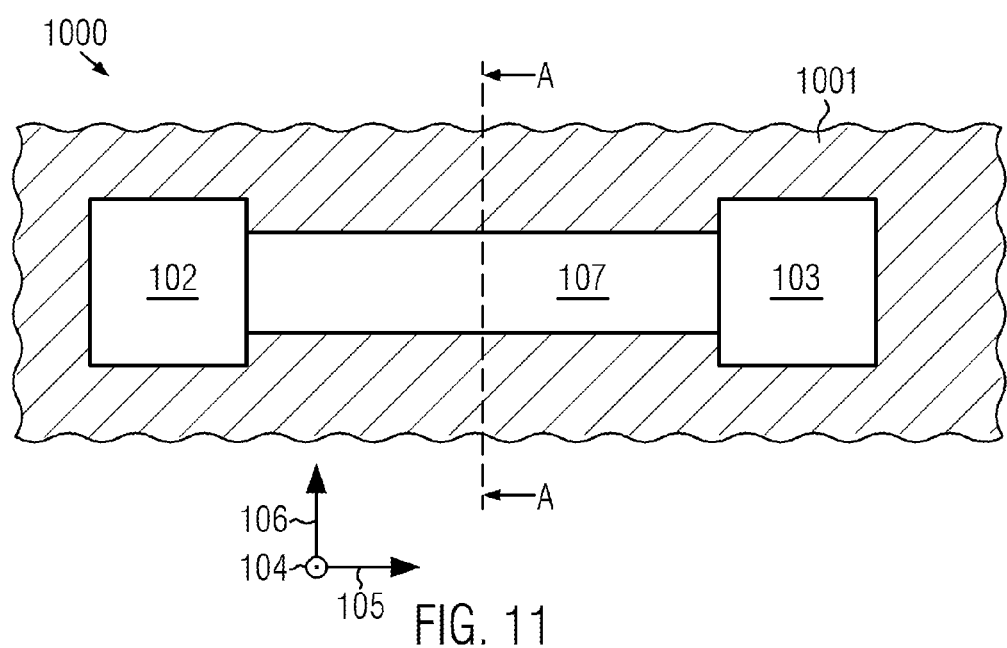

FIG. 10 shows a schematic cross-sectional view of a semiconductor structure 1000 according to an embodiment in a stage of a manufacturing process according to an embodiment. A schematic top view of the semiconductor structure 1000 is shown in FIG. 11, wherein FIG. 10 shows a cross-sectional view along the line A-A shown in FIG. 11. Views of the semiconductor structure 1000 in later stages of the manufacturing process are shown in FIGS. 12-15. For convenience, in FIGS. 1-9, on the one hand, and in FIGS. 10-15, on the other hand, like reference numerals have been used to denote like components. Features of components shown in FIGS. 10-15 may correspond to features of components described above with reference to FIGS. 1-9 denoted by like reference numerals, and conesponding methods may be used for the formation thereof, unless explicitly stated otherwise.

The semiconductor structure 1000 includes a substrate 101. In a portion of the substrate 101, a semiconductor region 107 and connection areas 102, 103 are provided. The semiconductor region 107 and the connection areas 102, 103 may be doped, as described above with reference to FIGS. 1-3.

Adjacent the semiconductor region 107 and the connection areas 102, 103, a trench isolation structure 1001 may be provided. The trench isolation structure 1001 may include an electrically insulating material, for example silicon dioxide, and may enclose the semiconductor region 107 and the connection areas 102, 103, providing an electrical insulation of a resistor that will be formed from the semiconductor region 107 and the connection areas 102, 103, as described in the following, from other circuit elements (not shown) in the semiconductor structure 1000.

The formation of the semiconductor structure 1000 as shown in FIGS. 10 and 11 may include providing the substrate 101, and forming the trench isolation structure 1001 in the substrate 101. The trench isolation structure 1001 may be a shallow trench isolation structure, and may be formed by forming a mask on the substrate 101 covering the semiconductor region 107 and the connection areas 102, 103. Then, an etch process, in particular an anisotropic dry etch process, for example a reactive ion etch process, may be performed for forming a trench adjacent the areas of the semiconductor region 107 and the connection areas 102, 103.

Due to the anisotropy of the etch process, sidewalls of the trench may be substantially parallel to a thickness direction 104 of the substrate 101, wherein the thickness direction 104 may be substantially perpendicular to a surface of the portion of the substrate 101 wherein the semiconductor region 107 and the connection areas 102, 103 are formed. Horizontal directions 105, 106 of the substrate are perpendicular to each other and to the thickness direction 104, as described above with reference to FIG. 1.

After the formation of the trench, the trench may be filled with an electrically insulating material, for example silicon dioxide. This may be done by means of techniques of oxidation, deposition and/or chemical mechanical polishing, as described above with reference to FIGS. 6 and 7.

Processes of ion implantation as described above with reference to FIG. 1 may be performed for forming the connection areas 102, 103 and the semiconductor region 107 by introducing dopant ions into the semiconductor material of the semiconductor region 107 and the connection areas 102, 103.

Figure 12:
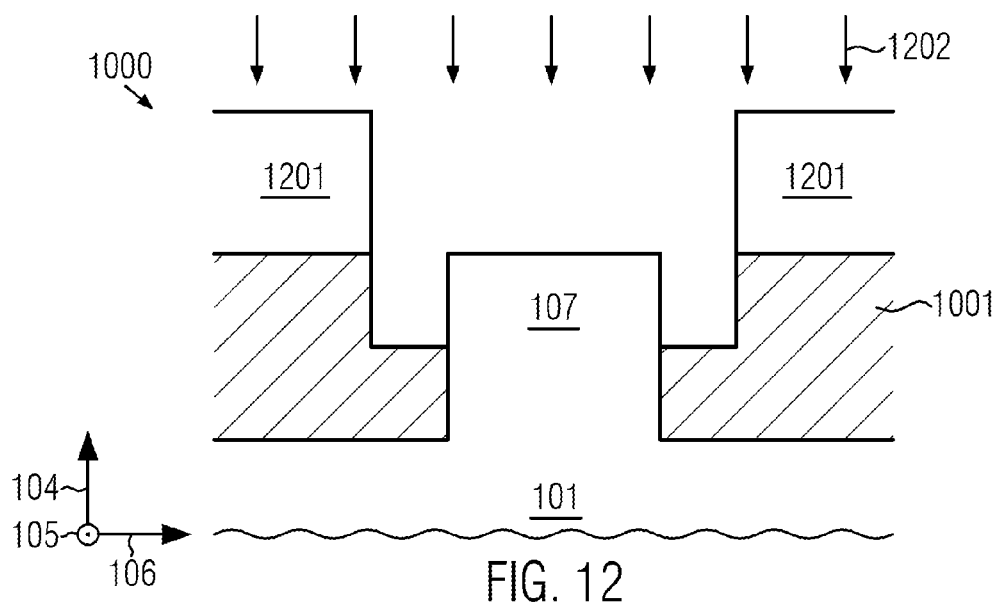

FIG. 12 shows a schematic cross-sectional view of the semiconductor structure 1000 in a later stage of the manufacturing process. A mask 1201 may be formed over the semiconductor structure 1000. The mask 1201 may cover portions of the trench isolation structure 1001 at a distance to the semiconductor region 107, wherein the mask 1201 does not cover the semiconductor region 107 and portions of the trench isolation structure 1001 adjacent the semiconductor region 107. Additionally, the mask 1201 may cover the connection areas 102, 103 and portions of the trench isolation structure 1001 adjacent the connection areas 102, 103.

An etch process 1202 that is adapted to selectively remove the electrically insulating material of the trench isolation structure 1001 relative to the semiconductor material of the semiconductor region 107 and the connection areas 102, 103 may be performed. For example, the etch process 1202 may be adapted to selectively remove silicon dioxide relative to silicon. In particular, the etch process may be an anisotropic dry etch process.

Due to the selectivity and anisotropy of the etch process 1202, portions of the trench isolation structure 1001 adjacent the semiconductor region 107 that are not covered by the mask 1201 may be removed, whereas the semiconductor region 107 is affected by the etchant to a relatively small extent only or is substantially not affected by the etchant at all. Portions of the trench isolation structure 1001 below the mask 1201 are also substantially not affected by the etchant. Thus, recesses may be formed in the electrically insulating material of the trench isolation structure 1001 adjacent the semiconductor region 107. The etch process 1202 may be stopped before the entire electrically insulating material adjacent the semiconductor region 107 is removed, as shown in FIG. 12, so that electrically insulating material remains at the bottom of the recesses.

Figure 13:
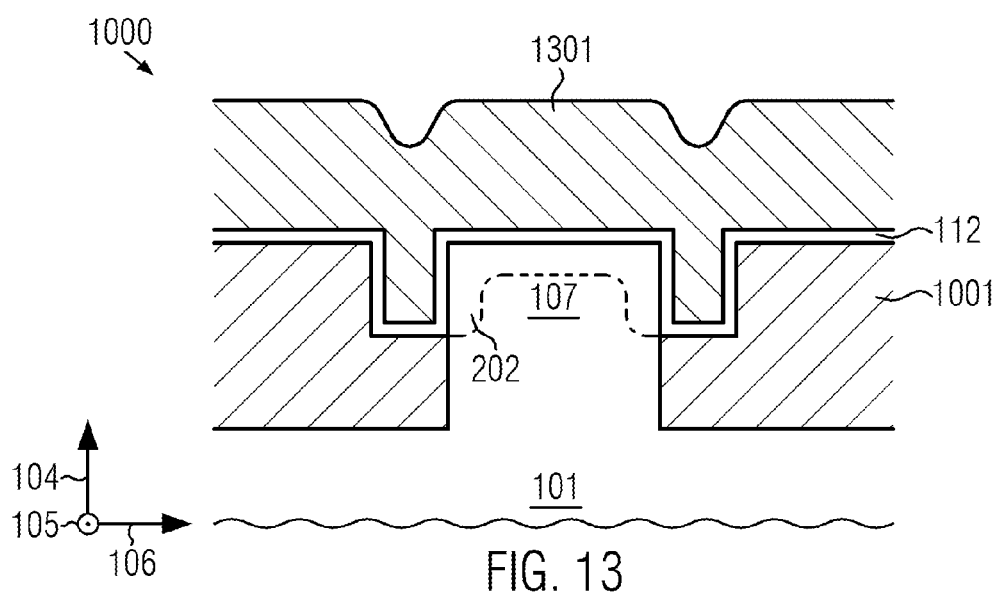

FIG. 13 shows a schematic cross-sectional view of the semiconductor structure 1000 in a later stage of the manufacturing process. After the etch process 1202, the mask 1201 may be removed, for example by means of a resist strip process, and a dielectric layer 112 including a species creating fixed charges may be formed over the semiconductor structure 1000. The dielectric layer 112 including a species creating fixed charges may be formed as described above with referenced to FIGS. 1-5, and the polarity of the fixed charges of the layer 112 may be selected in accordance with the doping of the semiconductor region 107, as described above. The presence of the dielectric layer 112 including fixed charges may induce the formation of a field effect region 202 in the semiconductor region 107. The field effect region 202 may include portions adjacent substantially vertical sidewalls of the semiconductor region 107 that are substantially parallel to the thickness direction 104 of the substrate 101, and portions adjacent a top surface of the semiconductor region 107 that is substantially perpendicular to the thickness direction 104.

After the formation of the layer 112 including the species creating fixed charges, a layer 1301 of an electrically insulating material may be deposited over the semiconductor structure 1000. The layer 1301 may be formed of substantially the same electrically insulating material as the trench isolation structure 1001. The layer 1301 may fill the recesses in the trench isolation structure 1001 that were created in the etch process 1202 described above with reference to FIG. 12, and may cover portions of the trench isolation structure 1001 in the semiconductor region 107.

Figure 14:
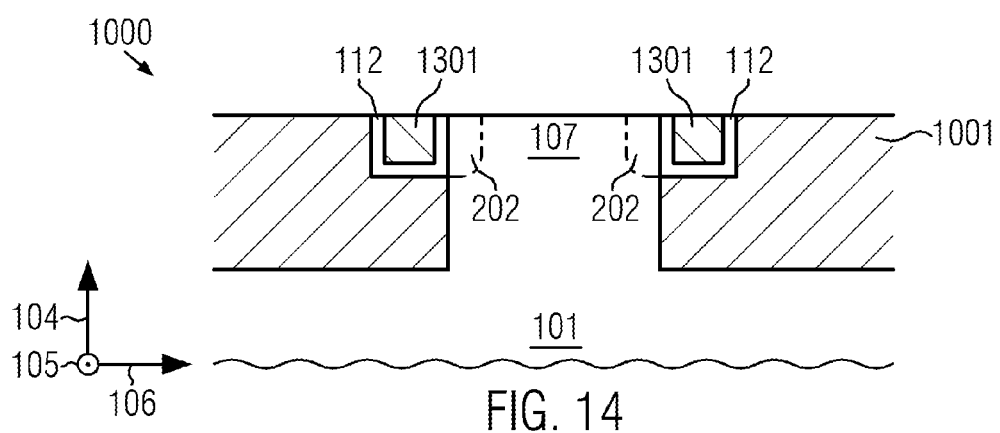
Figure 15:
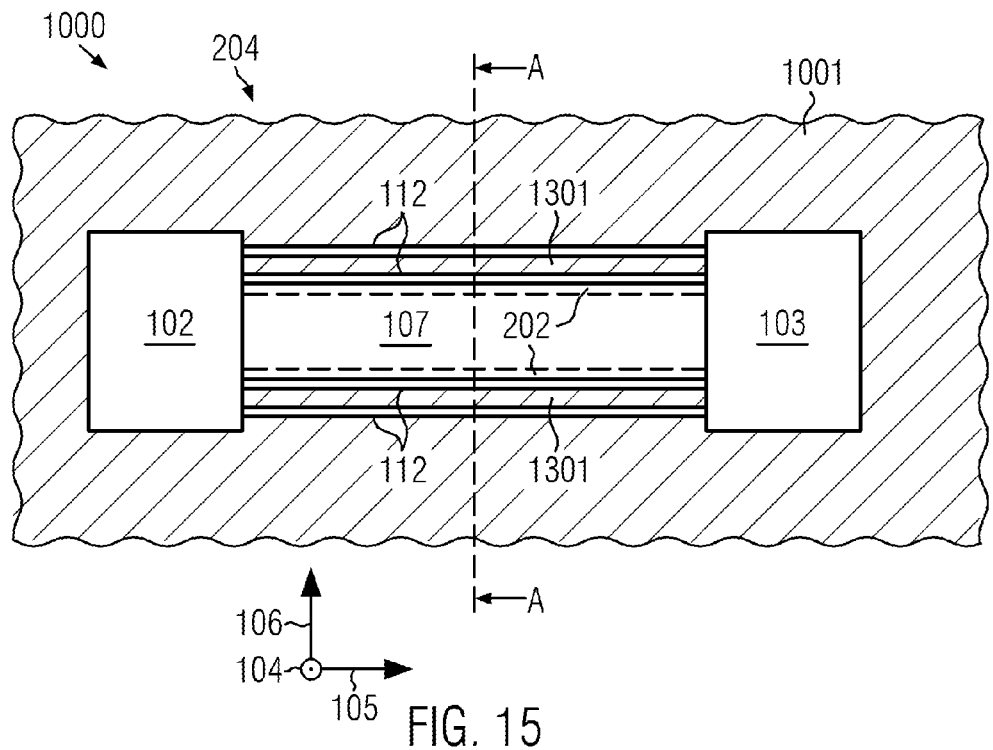

FIGS. 14 and 15 shows schematic views of the semiconductor structure 1000 in a later stage of the manufacturing process. After the deposition of the layer 1301 of electrically insulating material, a chemical mechanical polishing process may be performed. In the chemical mechanical polishing process, portions of the layer 1301 of electrically insulating material over the semiconductor region 107 as well as a portion of the dielectric layer 112 including the species creating fixed charges over the top surface of the semiconductor region 107 may be removed. Thus, after the chemical mechanical polishing process, the semiconductor material of the semiconductor region 107 is exposed at the surface of the semiconductor structure 1000. Additionally, portions of the layer 1301 of electrically insulating material and the dielectric layer 112 including the species creating fixed charges over the trench isolation structure 1001 may be removed. However, portions of the dielectric layer 112 including the species creating fixed charges and the layer 1301 of electrically insulating material that were deposited in the recesses of the trench isolation structure 1001 formed in the etch process 1202 described above with reference to FIG. 12 may remain in the semiconductor structure 1000.

In particular, the portions of the dielectric layer 112 including the species creating fixed charges on the sidewalls of the semiconductor region 107 that are substantially parallel to the thickness direction 104 of the substrate 101 may remain in the semiconductor structure 1000, so that the field effect region 202 adjacent the sidewalls of the semiconductor region 107 is maintained. However, due to the removal of the portion of the dielectric layer 112 including the species creating fixed charges from the top surface of the semiconductor region 107, no field effect region needs to be present adjacent the top surface of the semiconductor region 107.

Thereafter, an interlayer dielectric and contact vias filled with a metal for providing an electrical connection to the connection areas 102, 103 may be formed, as described above with reference to FIGS. 1-3. The connection areas 102, 103 and the semiconductor region 107 including the field effect region 202 provide a resistor 204.

Figure 16:
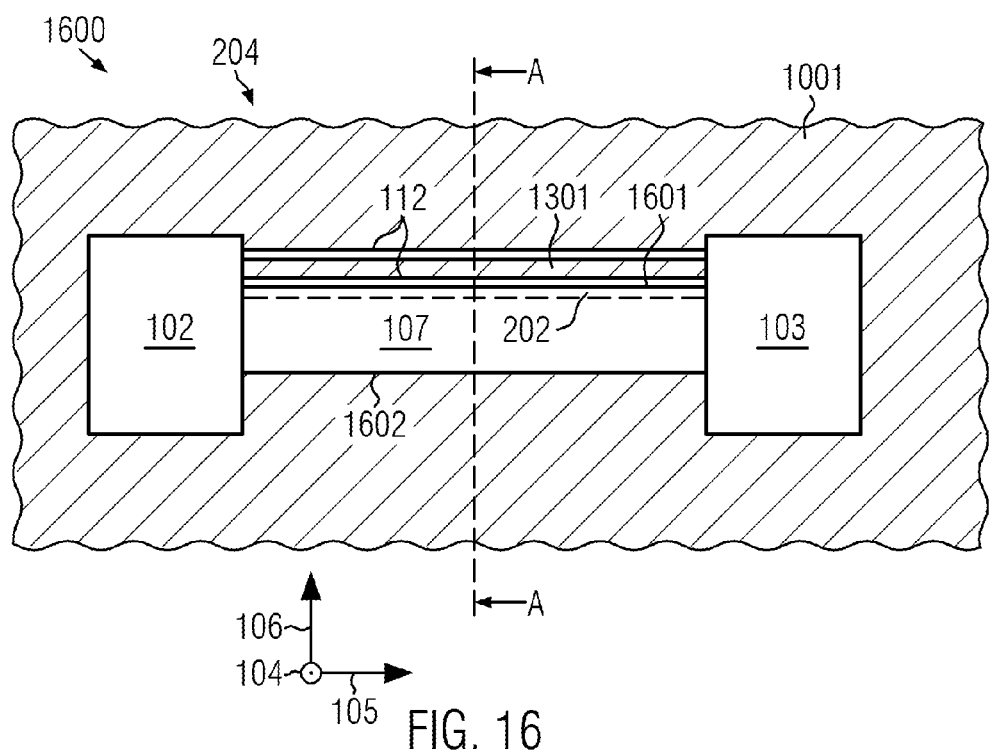
FIG. 16 shows a schematic top view of a semiconductor structure according to an embodiment.

FIG. 16 shows a schematic top view of a semiconductor structure 1600 according to a further embodiment. For convenience in FIG. 16, and in FIGS. 1-15, like reference numerals have been used to denote like components. Components shown in FIG. 16 may have features corresponding to those of components shown in FIGS. 1-15 denoted by like reference numerals, and like methods may be used for the formation thereof, unless explicitly stated otherwise. In particular, features of the semiconductor structure 1600 and the method of formation thereof may correspond to features of the embodiments described above with reference to FIGS. 10-15.

The semiconductor structure 1600 includes a substrate (not visible in the top view of FIG. 16), a semiconductor region 107, connection areas 102, 103 and a trench isolation structure 1001. Adjacent a first side surface 1601 of the semiconductor region 107 that may be substantially parallel to the thickness direction 104 of the substrate, a dielectric layer 112 including a species creating fixed charges is provided. The dielectric layer 112 including a species creating fixed charges creates a field effect region 202 in the semiconductor region 107, adjacent the first side surface 1601 of the semiconductor region 107. The semiconductor structure 1600 may further include a residue of a layer 1301 of electrically insulating material, similar to the layer 1301 of electrically insulating material described above with reference to FIGS. 13-15.

Different from the embodiment described above with reference to FIGS. 10-15, the semiconductor structure 1600 includes a second side surface 1602 of the semiconductor region 107 that is opposite to the first side surface 1601. At the second side surface 1602, no dielectric layer including a species creating fixed charges is provided. Instead, the second side surface 1602 of the semiconductor region 107 may abut to the trench isolation structure 1001.

The semiconductor structure 1600 may be formed by means of processes similar to those described above with reference to FIGS. 10-15 wherein, however, a mask similar to the mask 1201 described above with reference to FIG. 12 employed in the formation of a recess in the trench isolation structure 1001 covers the portion of the trench isolation structure 1001 adjacent the second side surface 1602 of the semiconductor region 107. Thus, a recess in the trench isolation structure 1001 as described above with reference to FIG. 12 is formed only adjacent the first side surface 1601 of the semiconductor region 107. Hence, portions of the dielectric layer 112 including the species creating fixed charges and the layer 1301 of electrical insulating material remain in the semiconductor structure 1600 only adjacent the first side surface 1601 of the semiconductor region 107.

The connection areas 102, 103 and the semiconductor region 107 having the dielectric layer 112 including the species creating fixed charges form a resistor 204. Compared to the resistor described above with reference to FIGS. 10-15, the resistor 204 shown in FIG. 16 may have a greater resistance, since the electrically conductive field effect region 202 is provided on only one side of the semiconductor region 107.

For providing an electrical connection to the resistor 204 shown in FIG. 16, contact vias filled with an electrically conductive material as described above with reference to FIGS. 1-3 may be employed.

The resistors 204 in the semiconductor structures 1000, 1600 described above with reference to FIGS. 10-16 need not have a substantially straight shape. Instead, a serpentine shape as described above with reference to FIGS. 6-9 may be provided.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor structure comprising a resistor, the resistor comprising:
    a semiconductor region;
    a dielectric layer provided over said semiconductor region, said dielectric layer comprising a high-k material having a greater dielectric constant than silicon dioxide, wherein said dielectric layer comprises a species creating fixed charges;
    a first electrical connection at a first end of said semiconductor region; and
    a second electrical connection at a second end of said semiconductor region.

2. The semiconductor structure of claim 1, wherein said species creating fixed charges comprises at least one of lanthanum, barium, scandium, praseodymium, neodymium and aluminum.

3. The semiconductor structure of claim 2, wherein said dielectric layer comprises at least one of an oxide of hafnium, an oxide of zirconium, hafnium aluminum oxide and hafnium lanthanum oxide.

4. The semiconductor structure of claim 3, wherein said dielectric layer further comprises silicon dioxide.

5. The semiconductor structure of claim 1, wherein no gate electrode is provided over said dielectric layer.

6. The semiconductor structure of claim 1, wherein said semiconductor region has a serpentine shape.

7. The semiconductor structure of claim 1, wherein said semiconductor structure comprises a substrate having a thickness direction, an extension of said substrate in said thickness direction being smaller than an extension of said substrate in any horizontal direction being perpendicular to said thickness direction and wherein said dielectric layer is provided on a surface of said semiconductor region that is substantially perpendicular to said thickness direction.

8. The semiconductor structure of claim 7, wherein said semiconductor structure comprises an isolation structure provided adjacent said semiconductor region, said isolation structure comprising an electrically insulating material.

9. The semiconductor structure of claim 8, wherein a semiconductor material that is not covered by said dielectric layer is provided adjacent said semiconductor region on which said dielectric layer is provided.

10. The semiconductor structure of claim 1, wherein said semiconductor structure comprises a substrate having a thickness direction, an extension of said substrate in said thickness direction being smaller than an extension of said substrate in any horizontal direction being perpendicular to said thickness direction, and wherein said dielectric layer is provided on a first surface of said semiconductor region that is substantially parallel to said thickness direction.

11. The semiconductor structure of claim 10, wherein said dielectric layer is further provided on a second surface of said semiconductor region that is substantially parallel to said thickness direction and is on a side of said semiconductor region opposite said first surface.

12. The semiconductor structure of claim 10, wherein said semiconductor region has a second surface that is substantially parallel to said thickness direction and is on a side of said semiconductor region opposite said first surface, and wherein said dielectric layer is not provided on said second surface.

13. The semiconductor structure of claim 1, wherein said semiconductor region is P-doped, and said fixed charges comprise positive charges.

14. The semiconductor structure of claim 1, wherein said semiconductor region is N-doped, and said fixed charges comprise negative charges.

15. A method, comprising:
    providing a semiconductor structure comprising a semiconductor region; and
    forming a resistor, the formation of said resistor comprising:
        forming a dielectric layer on said semiconductor region, said dielectric layer comprising a high-k material having a greater dielectric constant than silicon dioxide and a species creating fixed charges;
        forming a first electrical connection at a first end of said semiconductor region; and
        forming a second electrical connection at a second end of said semiconductor region.

16. The method of claim 15, wherein the formation of said dielectric layer comprises:
    forming at least one layer of a dielectric material on said semiconductor region;
    depositing a layer comprising said species on said layer of dielectric material; and
    performing an annealing process, wherein a portion of said species diffuses into said dielectric material, said species diffused into said dielectric material creating fixed charges.

17. The method of claim 16, wherein said at least one layer of dielectric material comprises a layer comprising silicon dioxide and a layer comprising a high-k dielectric material provided on said layer comprising silicon dioxide, and wherein said layer comprising said species comprises at least one of lanthanum, barium, scandium, praseodymium, neodymium and aluminum.

18. The method of claim 15, wherein the formation of said dielectric layer comprises depositing a layer comprising a chemical compound comprising hafnium, oxygen and at least one of lanthanum, barium, scandium, praseodymium, neodymium and aluminum on said semiconductor region.

19. The method of claim 15, wherein said semiconductor structure comprises a substrate having a thickness direction, an extension of said substrate in said thickness direction being smaller than an extension of said substrate in any horizontal direction being perpendicular to said thickness direction, and wherein said dielectric layer is formed on a surface of said semiconductor region that is substantially perpendicular to said thickness direction.

20. The method of claim 19, further comprising forming an isolation structure adjacent said semiconductor region.

21. The method of claim 19, further comprising providing a semiconductor material that is not covered by said dielectric layer adjacent said semiconductor region.

22. The method of claim 15, wherein said semiconductor structure comprises a substrate having a thickness direction, an extension of said substrate in said thickness direction being smaller than an extension of said substrate in any horizontal direction being perpendicular to said thickness direction, said semiconductor region having a horizontal surface that is substantially perpendicular to said thickness direction, and wherein the formation of said dielectric layer on said semiconductor region comprises:

forming an isolation structure comprising an electrically insulating material adjacent said semiconductor region;

performing an etch process selectively removing a portion of said electrically insulating material, wherein a recess is formed adjacent said semiconductor region and at least one vertical surface of said semiconductor region that is substantially parallel to said thickness direction is exposed;

wherein said dielectric layer is formed on said at least one vertical surface of said semiconductor region and on said horizontal surface of said semiconductor region;

after depositing said dielectric layer, filling said recess with said electrically insulating material; and performing a planarization process, wherein a portion of said dielectric layer on said horizontal surface of said semiconductor region is removed.

23. The method of claim 22, wherein said at least one vertical surface comprises a first vertical surface and a second vertical surface, said second vertical surface being on an opposite side of said semiconductor region than said first vertical surface.

24. A semiconductor structure, comprising:
a first and a second resistor;
said first resistor comprising:
    a first semiconductor region;
    a first dielectric layer provided on a surface of said first semiconductor region, said first dielectric layer comprising a first high-k material having a greater dielectric constant than silicon dioxide, wherein said first dielectric layer comprises a first species creating fixed charges of a first polarity; and
    a first pair of electrical connections at opposite ends of said first semiconductor region;
said second resistor comprising:
    a second semiconductor region;
    a second dielectric layer provided on a surface of said second semiconductor region, said second dielectric layer comprising a second high-k material having a greater dielectric constant than silicon dioxide, wherein said second dielectric layer comprises a second species creating second charges of a second polarity, said second polarity being opposite to said first polarity; and
    a second pair of electrical connections at opposite ends of said second semiconductor region;
wherein said first and said second semiconductor regions are differently doped.

* * * * *